(12) United States Patent
Annunziata et al.

(10) Patent No.: US 9,614,146 B2
(45) Date of Patent: Apr. 4, 2017

(54) ARMATURE-CLAD MRAM DEVICE

(71) Applicants: INTERNATIONAL BUSINESS MACHINES CORPORATION, Armonk, NY (US); CROCUS TECHNOLOGY, Santa Clara, CA (US)

(72) Inventors: Anthony J. Annunziata, Stamford, CT (US); Erwan Gapihan, White Plains, NY (US)

(73) Assignees: INTERNATIONAL BUSINESS MACHINES CORPORATION, Armonk, NY (US); CROCUS TECHNOLOGY, Santa Clara, CA (US)

( * ) Notice: Subject to any disclaimer, the term of this patent is extended or adjusted under 35 U.S.C. 154(b) by 0 days.

(21) Appl. No.: 15/222,547

(22) Filed: Jul. 28, 2016

(65) Prior Publication Data
US 2016/0336506 A1  Nov. 17, 2016

Related U.S. Application Data

(62) Division of application No. 14/220,890, filed on Mar. 20, 2014, now Pat. No. 9,472,749.

(51) Int. Cl.
| H01L 29/82 | (2006.01) |
| H01L 43/08 | (2006.01) |
| H01L 43/02 | (2006.01) |
| H01L 43/12 | (2006.01) |

(52) U.S. Cl.
CPC .............. *H01L 43/08* (2013.01); *H01L 43/02* (2013.01); *H01L 43/12* (2013.01)

(58) Field of Classification Search
CPC ......... H01L 43/02; H01L 43/08; H01L 43/12; H01L 29/82; H01L 27/222; G11C 11/161
USPC ............................................ 257/421; 438/48
See application file for complete search history.

(56) References Cited

U.S. PATENT DOCUMENTS

| 5,659,499 A | 8/1997 | Chen et al. |
| 6,555,858 B1 | 4/2003 | Jones et al. |
| 6,559,511 B1 | 5/2003 | Rizzo |
| 6,819,586 B1 | 11/2004 | Anthony et al. |
| 6,911,685 B2 | 6/2005 | Anthony et al. |
| 7,170,775 B2 | 1/2007 | Lin et al. |
| 8,031,519 B2 | 10/2011 | Javerliac et al. |

(Continued)

OTHER PUBLICATIONS

Durlam, M., et al. "A Low Power 1 MBIT MRAM Based on 1T1MTJ Bit Cell Integrated With Copper Interconnects" 2002 Symposium on VLSI Circuits Digest of Technical Papers. Jun. 2002. pp. 158-161.

(Continued)

*Primary Examiner* — Tu-Tu Ho
(74) *Attorney, Agent, or Firm* — Tutunjian & Bitetto, P.C.; Vazken Alexanian

(57) ABSTRACT

A magnetoresistive memory cell includes a magnetoresistive tunnel junction stack and a dielectric encapsulation layer covering sidewall portions of the stack and being opened over a top of the stack. A conductor is formed in contact with a top portion of the stack and covering the encapsulation layer. A magnetic liner encapsulates the conductor and is gapped apart from the encapsulating layer covering the sidewall portions of the stack.

20 Claims, 11 Drawing Sheets

(56) References Cited

U.S. PATENT DOCUMENTS 8,357,982 B2 * 1/2013 Kajiyama ............... G11C 11/16
257/421

OTHER PUBLICATIONS

Shimura, K., et al. "Magnetic and Writing Properties of Clad Lines Used in a Toggle MRAM" IEEE Transactions on Magnetics, vol. 42, No. 10. Oct. 2006. pp. 2736-2738.
Sousa, R.C., et al. "Non-Volatile Magnetic Random Access Memories (MRAM)" Elsevier Science. Oct. 2005. pp. 1-10.

* cited by examiner

ARMATURE-CLAD MRAM DEVICE

BACKGROUND

Technical Field

The present invention relates to structures and methods for fabrication of a magnetoresistive random access memory (MRAM) device, and more particularly to MRAMs with a read and write field line that utilizes an armature-like magnetic cladding to increase the magnetic field generated per unit current to decrease power of read and write operations, and enable denser memory arrays with read/write field drivers (transistors).

Description of the Related Art

Thermally-assisted magnetoresistive random access memory (TAS-MRAM) heats a magnetic tunnel junction stack (MTJ) to a write temperature ($T_{write}$) higher than a maximum storage temperature ($T_{store}$) to write to the device. The device includes a storage magnetic layer, and a sense magnetic layer, separated by a non-magnetic tunnel barrier. Electrical resistance of this stack depends on the relative orientation of portions of the storage and sense layers that interface with the tunnel barrier. This effect is caused by a tunneling magnetoresistance (TMR) phenomenon. In typical devices, an anti-ferromagnetic layer pins the storage layer at $T_{MTJ} < T_{store}$ where $T_{MTJ}$ is the magnetic tunnel junction stack temperature, and $T_{store}$ is the storage temperature. The sense magnetic layer is free to toggle back and forth by an applied field.

If the magnetic orientation of the sense layer is parallel to the magnetic orientation of the storage layer, then the MTJ stack will have low resistance; if the sense layer is anti-parallel to the storage layer, the stack will have high resistance. The device is read out by toggling the sense layer in both directions by an applied field of two known directions, and determining the direction of the storage layer based on the resistance change.

To write the device into a logical "1" or "0" state, a heating current is passed through the device in order to raise $T_{MTJ} > T_{write}$, which depins the storage layer by suppressing the antiferromagnetism in the antiferromagnetic pinning layer, allowing an applied field to reset the storage layer magnetization into the "1" state direction, or to the "0" state direction. The storage layer may include a single magnetic layer, or a synthetic antiferromagnetic layer; each of these magnetic layers may, in turn, include several distinct alloys, compound materials and material layers. In all cases, the write operation requires reorienting the magnetization of the layer interfacing with the barrier to either the "1" or "0" state direction.

To read the device or write the device into a logical "1" or "0" state, a field must be applied from a current-carrying metal wire located close to the device. Conventional structures often consume a large amount of power using this field line to create sufficient field generated per unit current in the field line during read and write operations.

SUMMARY

A magnetoresistive memory cell includes a magnetoresistive tunnel junction stack and a dielectric encapsulation layer covering sidewall portions of the stack and being opened over a top of the stack. A conductor is formed in contact with a top portion of the stack and covering the encapsulation layer. A magnetic liner encapsulates the conductor and is gapped apart from the encapsulating layer covering the sidewall portions of the stack.

A magnetoresistive memory cell includes a dielectric substrate layer having a conductive line and via coupled to a strap line. A magnetoresistive tunnel junction stack is coupled to the strap line. A dielectric encapsulation layer covers sidewall portions of the stack and is opened over a top of the stack. An interlevel dielectric layer is formed over the dielectric encapsulation layer and forms a trench within which the stack is disposed. A conductor is formed in contact with a top portion of the stack and covers the encapsulation layer within the trench. A ferromagnetic liner lines sidewalls of the trench and encapsulates the conductor in at least two directions, the ferromagnetic liner being gapped apart from the encapsulating layer covering the sidewall portions of the stack.

A method forming a magnetoresistive memory cell includes forming a magnetoresistive memory tunnel junction stack over a connection line formed in a dielectric substrate layer; conformally depositing a dielectric encapsulation layer over the stack and the dielectric substrate layer; forming an interlevel dielectric layer over the dielectric encapsulation layer; etching a trench in the interlevel dielectric layer stopping on the dielectric encapsulation layer over the stack; depositing a magnetic liner in the trench and on the dielectric encapsulation layer over the stack; etching a gap in the magnetic liner to space the liner from sidewalls of the dielectric encapsulation layer and to remove the dielectric encapsulation layer to expose the stack; depositing a conductor in the trench and in the gap; and planarizing the conductor and the magnetic liner to a top surface of the interlevel dielectric layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
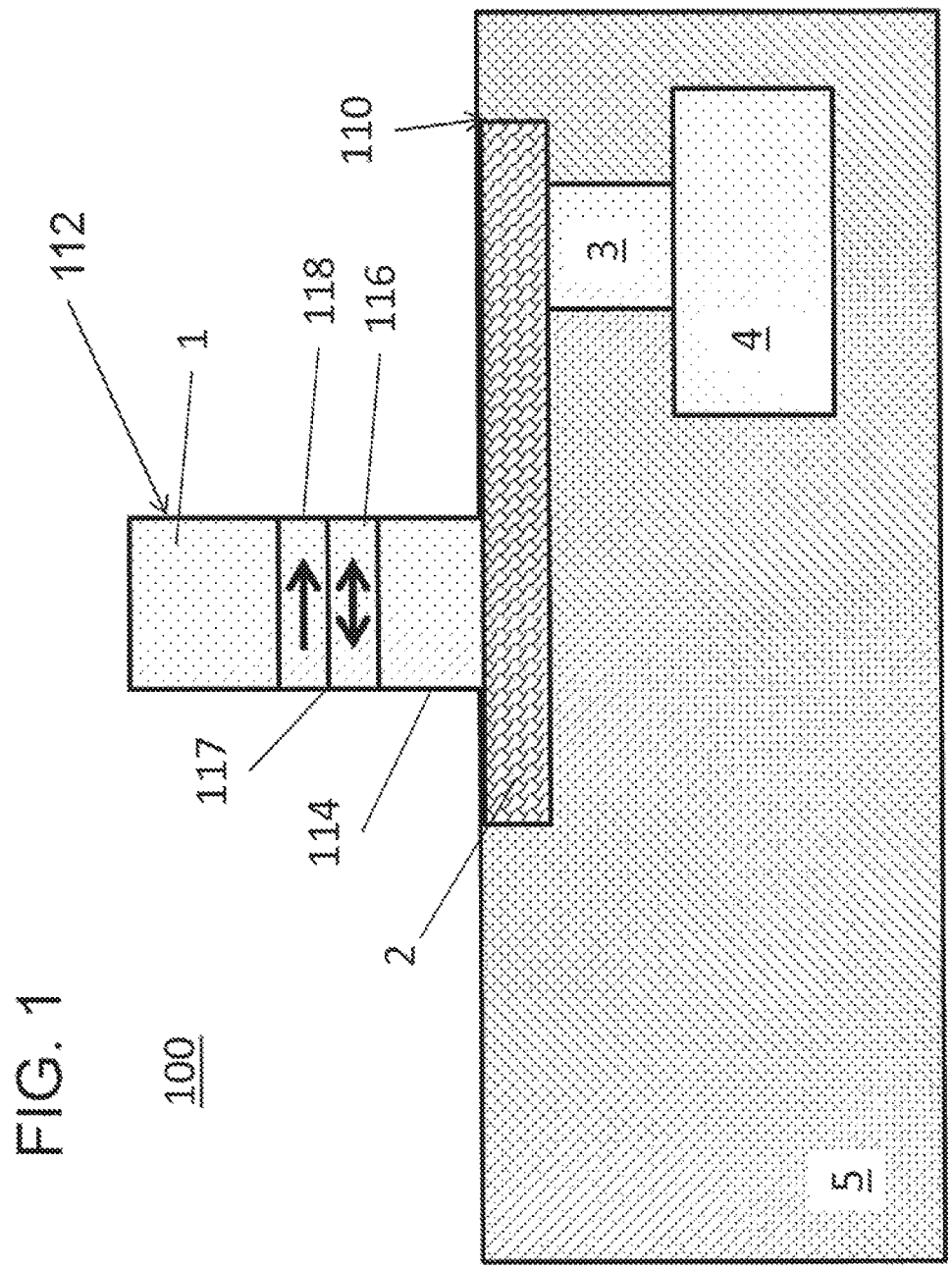
FIG. 1 is a cross-sectional view of a device structure showing a magnetoresistive memory cell stack for a magnetoresistive random access memory (MRAM) device in accordance with the present principles.

In accordance with the present principles, device structures and fabrication methods are provided to reduce power usage and increase device efficiency in magnetoresistive memory elements, and in particular, magnetoresistive random access memory (MRAM) elements. In one embodiment, a device includes an integrated armature-like structure that focuses a field on to the MRAM device, increasing the efficiency of field generation (magnetic field per unit current) and reducing stray field incident on nearest neighbor MRAM devices. This reduces the power consumed, and also the disturbance of nearest neighbors during write operations.

In particularly useful embodiments, the armature-like structure, gapped core or yoke is employed to focus its magnetic field to a location where the magnetic field is written to or read from a magnetic storage material. The armature-like structure preferably intensifies the magnetic field at a particularly sensitive region (e.g., on the magnetic layer stack).

To read the device or write the device into a logical "1" or "0" state, the field needs to be applied from a current-carrying metal wire located close to the device. The present structures may include magnetic cladding on this field line to enhance the field generated per unit current in the field line, thereby increasing the efficiency and reducing the power consumed during read and write operations. Methods for fabrication of these structures are also described.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods, as described, may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present embodiments may be part of a memory device or circuit, and the circuits as described herein may be part of a design for an integrated circuit chip, a system on a chip, a solid-state memory device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This may be extended, as readily apparent by one of ordinary skill in this and related arts, for as many items listed.

Referring now to the drawings in which like numerals represent the same or similar elements and initially to FIG. 1, a cross-sectional view of a partially fabricated magnetoresistive memory device 100 is illustrative shown. The device 100 includes a dielectric substrate 5 having a metal line 4 and a via 3 formed therein. The dielectric substrate 5 may include a dielectric layer, e.g., a silicon oxide, a silicon nitride, silicate glass, organic dielectric, etc. formed on another substrate or layer (e.g., a semiconductor substrate or layer, a metal, glass, ceramic, a printed wiring board, etc. The metal line 4 and via 3 may be formed by known processing techniques. In one embodiment, the metal line 4 may be formed by, e.g., etching a trench for the metal line 4 in substrate or layer 5, depositing a conductive material, e.g., W, Al, Cu, etc. and planarizing a top surface to form the metal line 4. Then, a dielectric layer may be deposited and patterned to form an opening or via hole followed by depositing a conductive material, e.g., W, Al, Cu, etc. and planarizing a top surface to form the via 3. Other processes may also be employed. Metal line 4 connects to an access transistor (not shown).

A recess 110 is formed through a top surface of the dielectric layer 5. A strap conductor 2 is formed in the recess 110 to connect to the via 3 and extend below a magnetic junction stack 112. The magnetic tunnel junction stack 112 may include a number of different configurations. In one embodiment, a barrier layer (dielectric) 114 is formed over the strap conductor 2 and the surface of the dielectric layer 5. Magnetic storage layers are formed over the barrier layer 114. The magnetic tunnel junction layers include a storage magnetic layer 116, and a sense magnetic layer 118, separated by a non-magnetic tunnel barrier 117 in a thermally-assisted magnetoresistive random access memory (TAS-MRAM). A thermal barrier (dielectric) 1 is formed over the magnetic tunnel junction layers. Then, the entire stack 112 is patterned or formed by a masked etching process to dimension the stack 112. Other numbers and types of layers may be employed in the stack 112.

Figure 2:
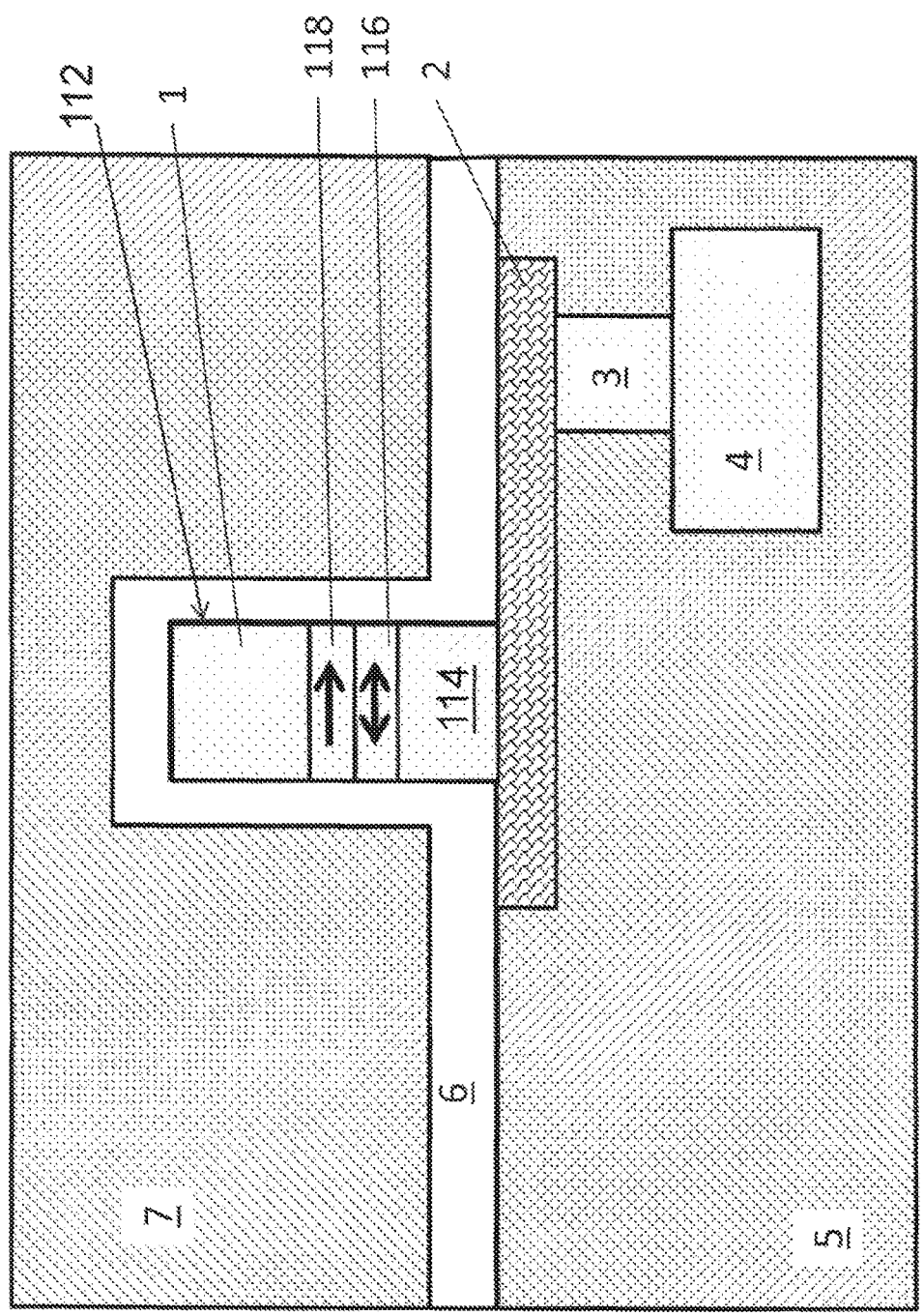
FIG. 2 is a cross-sectional view of the device structure of FIG. 1 having a dielectric encapsulation layer deposited to protect the MRAM device stack and avoid any corrosion or damage of magnetic layers thereof and having an interlevel dielectric layer formed thereon in accordance with the present principles.

Referring to FIG. 2, a dielectric encapsulation layer 6 is formed over a top and sides of the stack 112. The encapsulation layer 6 is deposited to protect the MRAM device stack 112 and avoid any corrosion or damage of the magnetic layers 116, 118. The dielectric layer 6 may include, e.g., SiN or other conformal dielectric coating material. An interlayer dielectric material 7 is formed over the encapsulating layer 6. The interlevel dielectric materials 7 may include a silicon oxide or other material that can be etched selectively with respect to the encapsulation layer 6.

Figure 3:
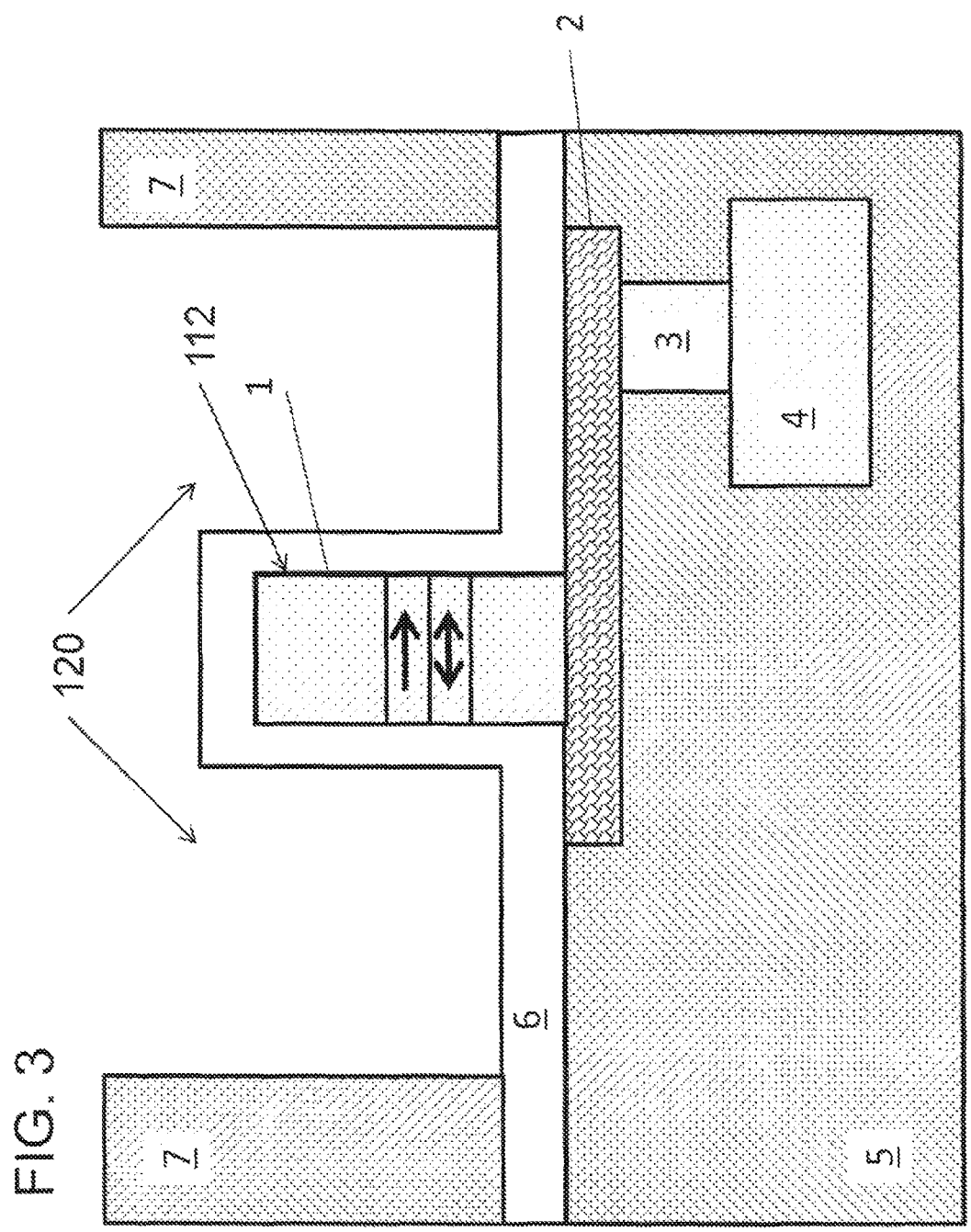
FIG. 3 is a cross-sectional view of the device structure of FIG. 2 having a trench etched down to the dielectric encapsulation layer through the interlevel dielectric layer to expose the MRAM device stack in accordance with the present principles.

Referring to FIG. 3, a mask, e.g., a photolithographic mask, is patterned on the interlevel dielectric material 7 and used to etch a recess 120 down to the encapsulation layer 6. The interlevel dielectric material 7 is etched selectively to the encapsulation layer 6. The encapsulation layer 6 protects the magnetic layers 116, 118 during the etching process. The etching process may include a reactive ion etch (RIE) process, although other etching processes may be employed.

Figure 4:
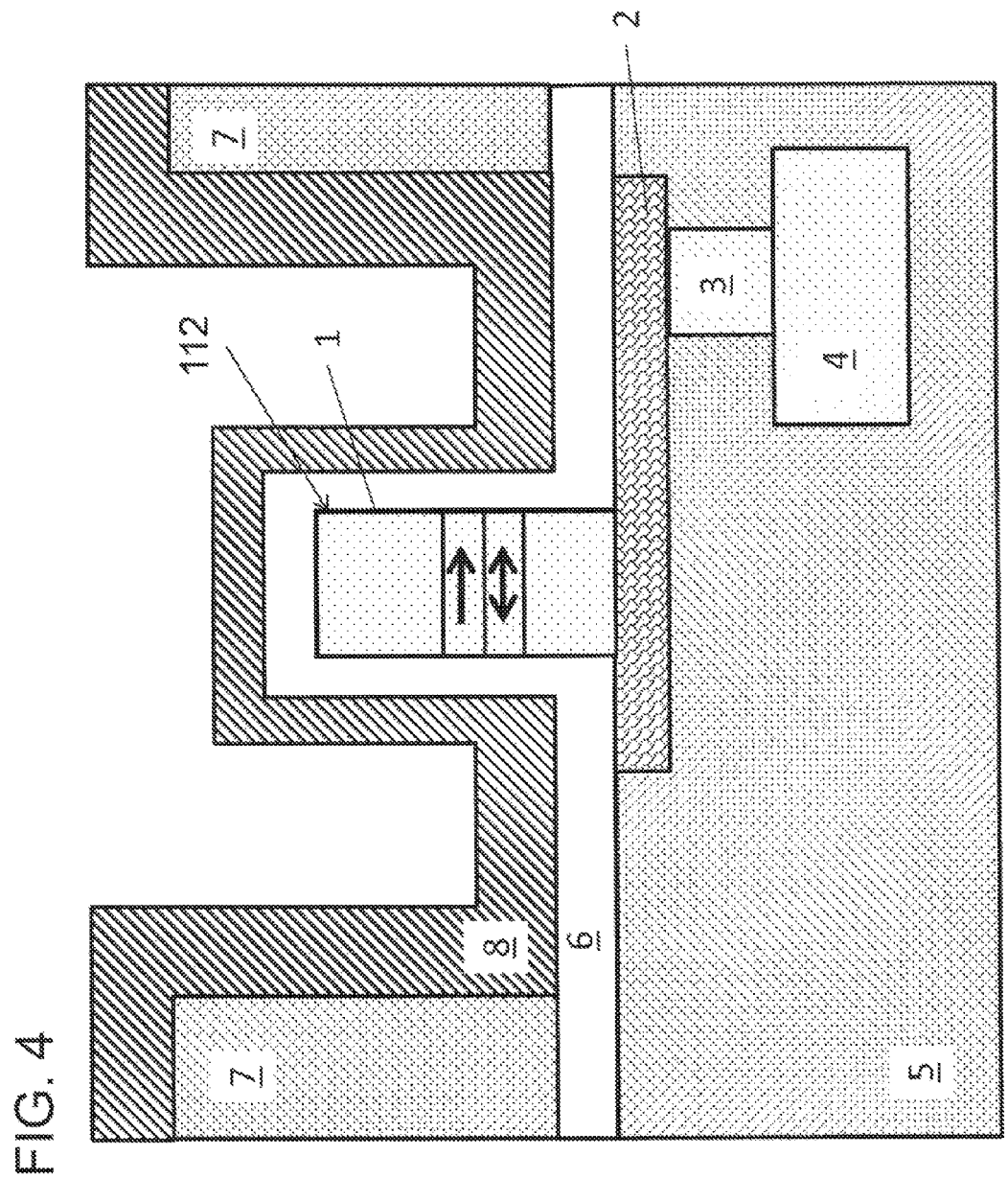
FIG. 4 is a cross-sectional view of the device structure of FIG. 3 having a magnetic liner (e.g., a ferromagnetic cladding layer) conformally deposited in accordance with the present principles.

Referring to FIG. 4, a magnetic liner or cladding layer 8 is deposited over the interlevel dielectric layer 7 and the encapsulation layer 6. The magnetic liner 8 preferably includes ferromagnetic or paramagnetic materials, such as Fe, Co, Ni, alloys or combinations of these and other materials. Deposition processes may include but are not limited to, sputtering, evaporation, chemical vapor deposition (CVD), plasma enhanced CVD, etc.

Figure 5:
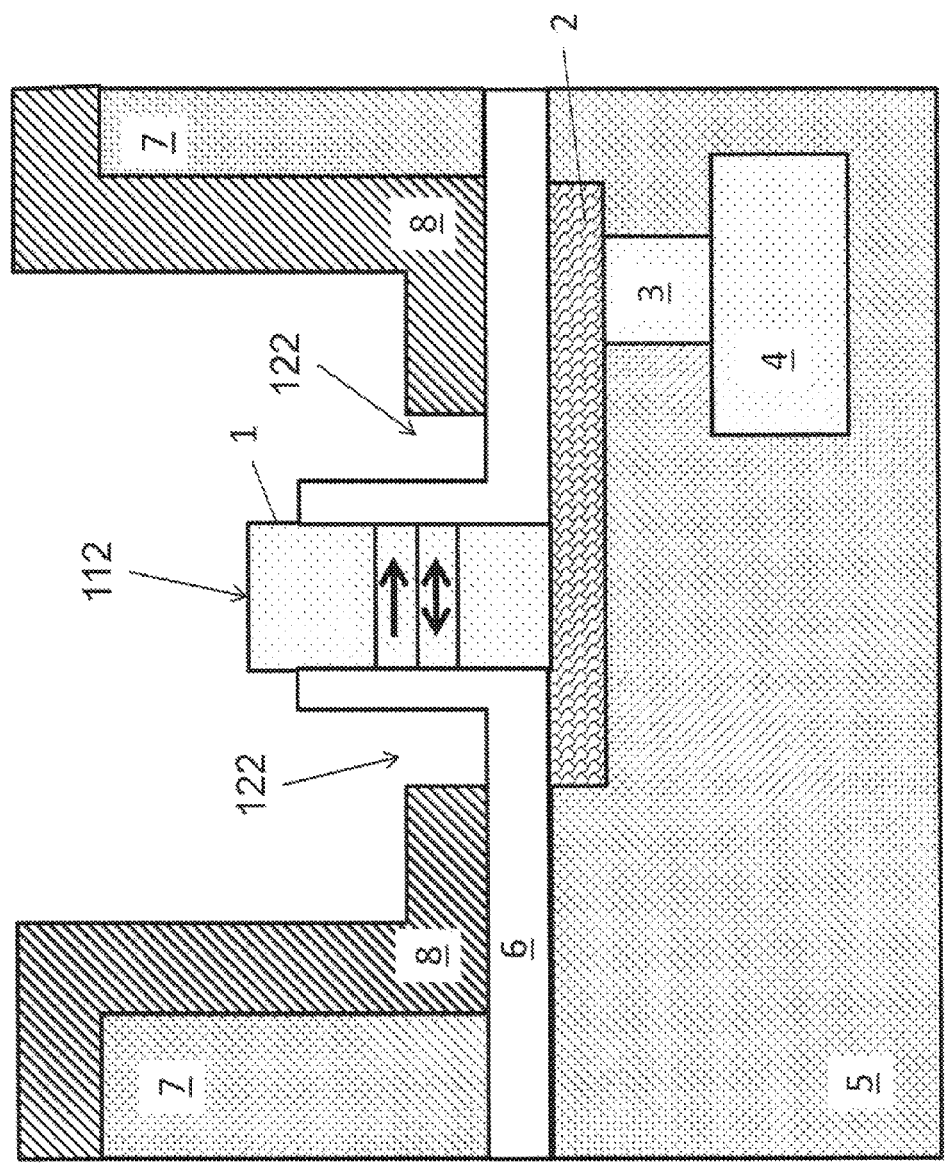
FIG. 5 is a cross-sectional view of the device structure of FIG. 4 after lithographic pattern formation and etching of the liner cladding layer around the MRAM device, leaving a gap in the cladding layer that terminates closely on either side of the MRAM device stack in accordance with the present principles.

Referring to FIG. 5, lithography and etch steps are performed on the cladding liner 8 to remove the liner 8 in an area around the stack 112, e.g., form a gap 122. An etch mask may be formed using lithography to protect portions of the liner 8 and to expose portions of the liner 8 over the stack 112. The etching process (e.g., RIE) removes the liner 8 and the encapsulation layer 6 over a top of the stack 112 exposing the thermal barrier 1. The liner 8 forms around the MRAM device stack 112, leaving the gap 122 in the ferromagnetic cladding liner 8 that terminates closely on either side of the MRAM device stack 112.

Figure 6:
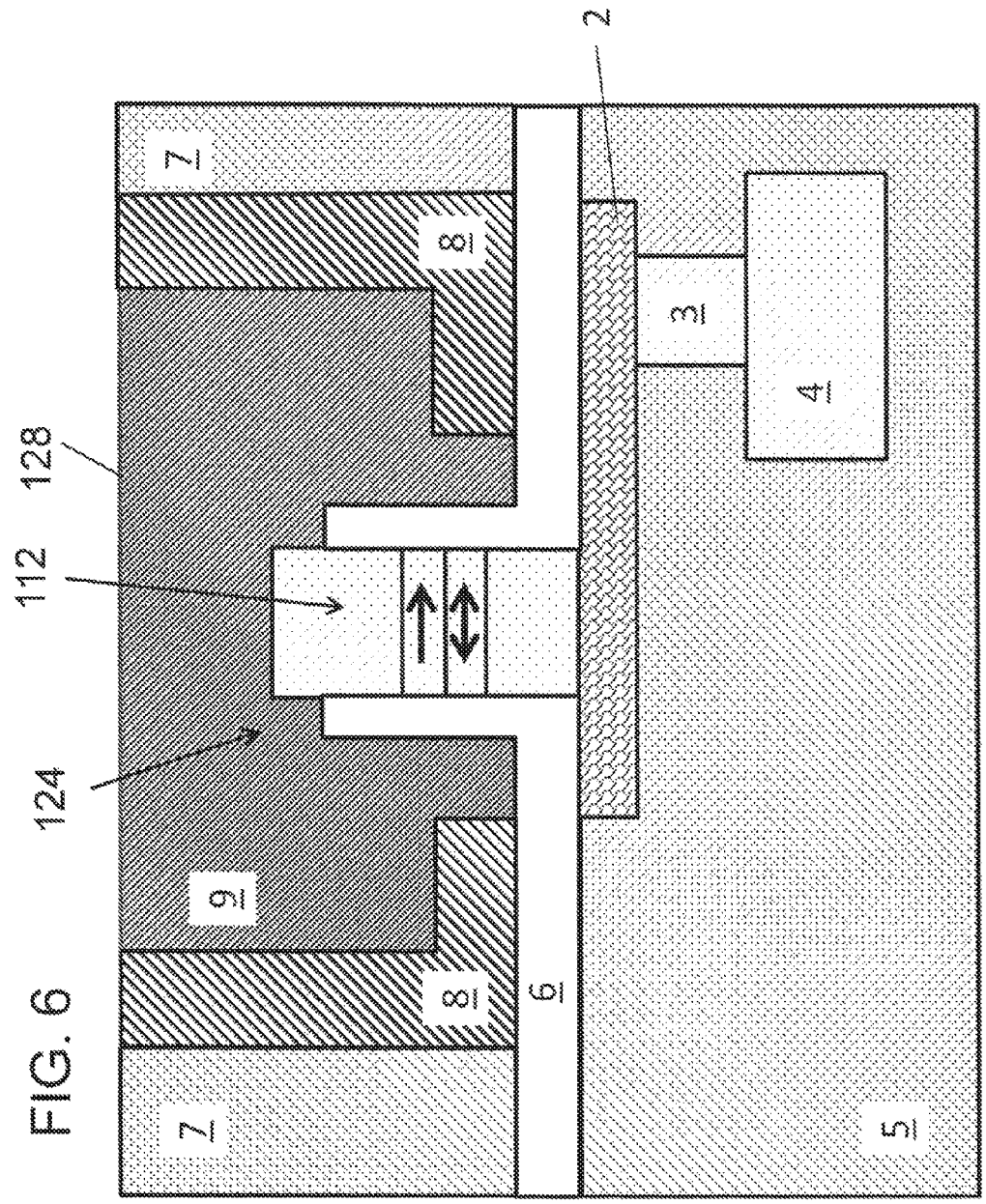
FIG. 6 is a cross-sectional view of the device structure of FIG. 5 after depositing a conductor/plating layer to fill the trench with and create a top contact on the device stack by chemical mechanical polishing (CMP) to remove the excess conductor, to form a line and to polish the magnetic liner/cladding layer to form an armature-clad field wire in accordance with the present principles.

Referring to FIG. 6, a plating material 9 is deposited to fill the recess or trench 120. The plating material 9 and the liner 8 are planarized in a single step or multiple stepped chemical mechanical polishing (CMP) process. The planarization may include a CMP to remove the excess material (9). This polish stops on the liner ferromagnetic cladding layer 8. Then, another CMP of the liner ferromagnetic cladding layer 8 may be performed to remove the magnetic material of liner 8 outside the trench (120). Note that the fabrication process of the MRAM device could end with the formation of a planarized surface 124 over the magnetic tunnel junction (MTJ) stack 112 without performing the steps outline below. The plating material 9 forms a top contact 128 on the armature-clad field wire formed by liner 8. The plating material 9 preferably includes a highly conductive material, such as, e.g., Cu, Al, Ag, Au, etc. The plating material 9 may be formed using a chemical vapor deposition process, although other processes, such as, sputtering or evaporation may be employed.

Figure 7:
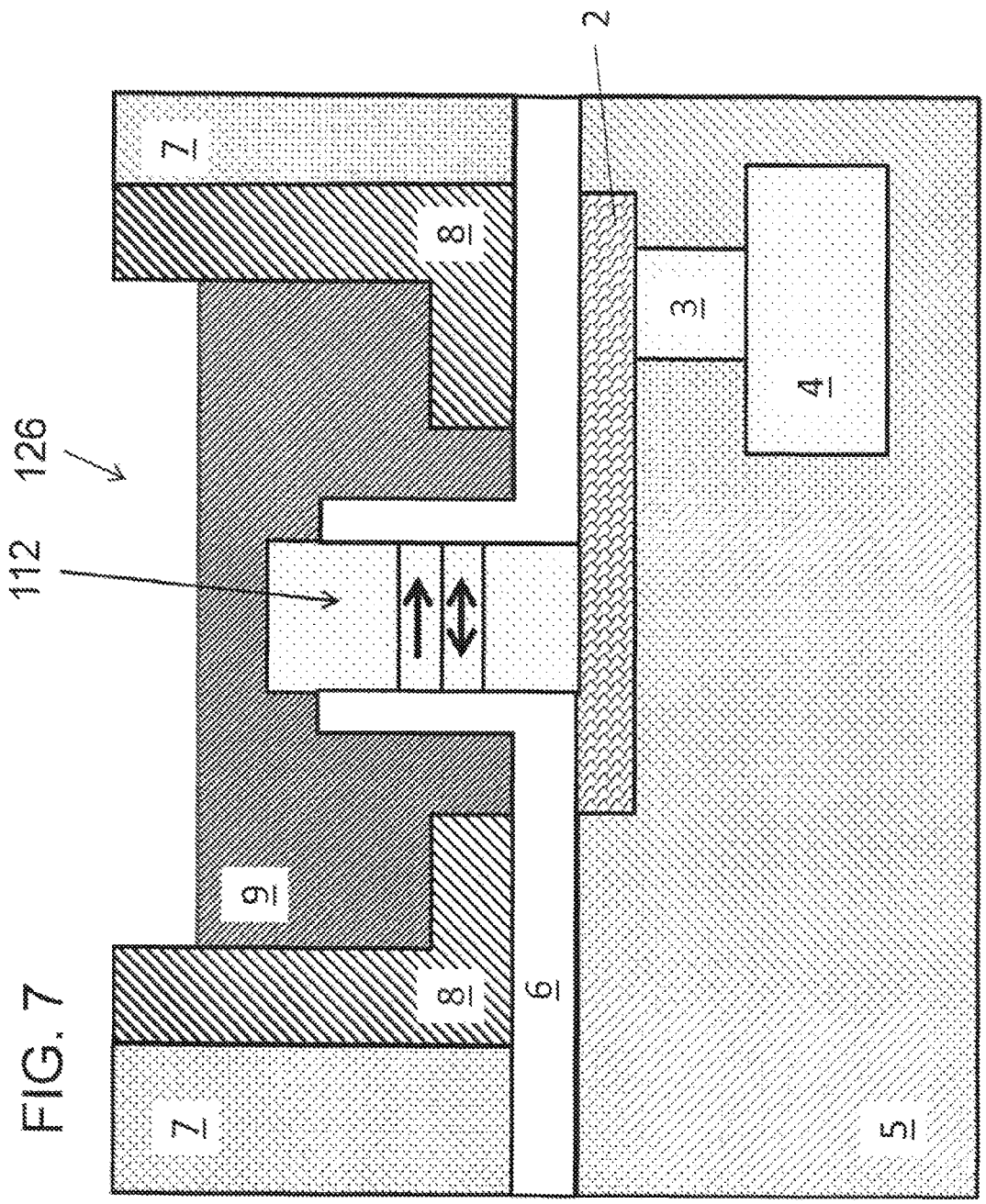
FIG. 7 is a cross-sectional view of the device structure of FIG. 6 after recessing the conductor/plating layer in the trench in accordance with the present principles.

Referring to FIG. 7, a recess etch may be performed selective to the dielectric material 7 and the liner 8 to form a recess 126 in the plating material 9. The recess etch may be performed by a chemical etch that selectively removes the plating material 9 down to a position where plating material 9 still covers the thermal barrier 1.

Figure 8:
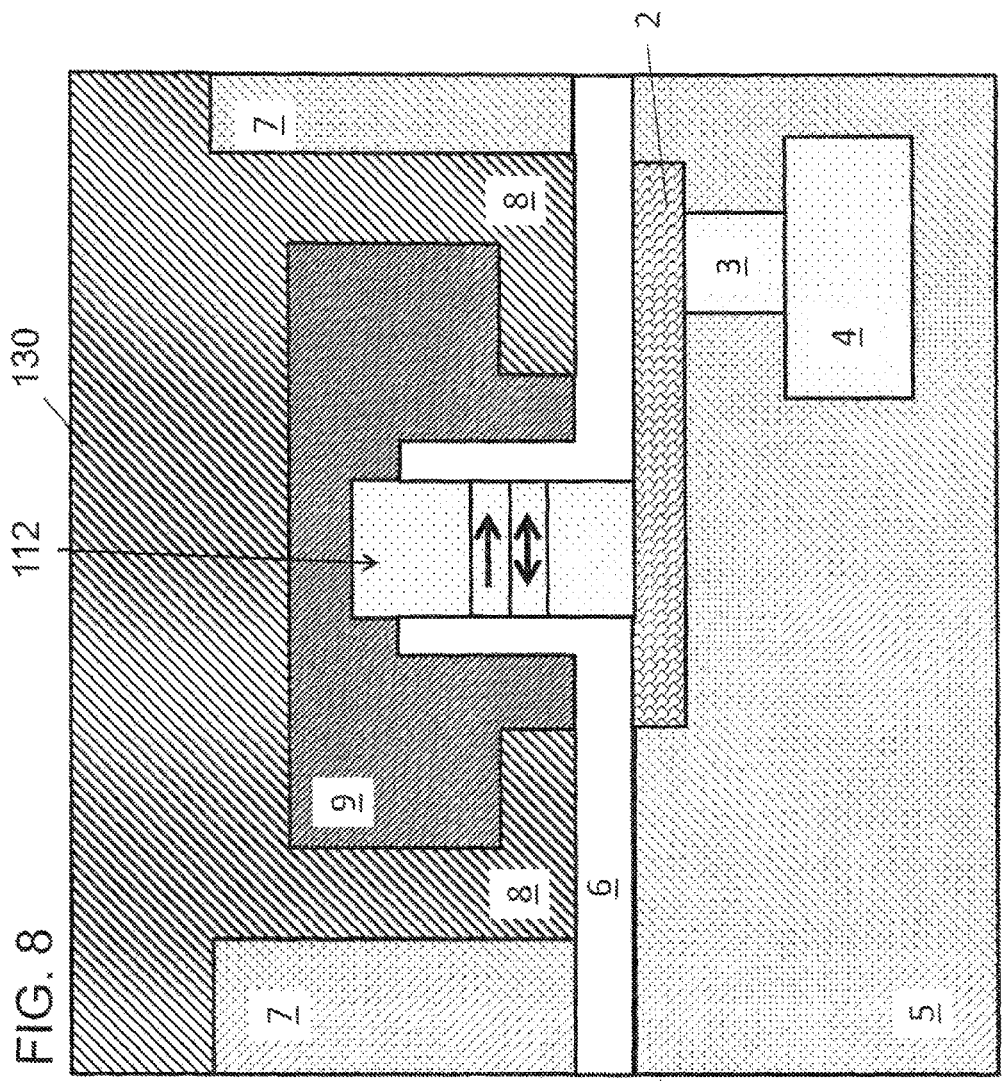
FIG. 8 is a cross-sectional view of the device structure of FIG. 7 after deposition of a top magnetic liner to fill the recess in accordance with the present principles.

Referring to FIG. 8, an additional deposition process is performed to provide a magnetic layer 130 to fill the recess 126. The magnetic layer 130 is configured to form a top connection of the liner 8. The magnetic layer 130 preferably includes a same or similar material as the liner 8 and preferably includes a ferromagnetic material (e.g., Fe, Co, etc.).

Figure 9:
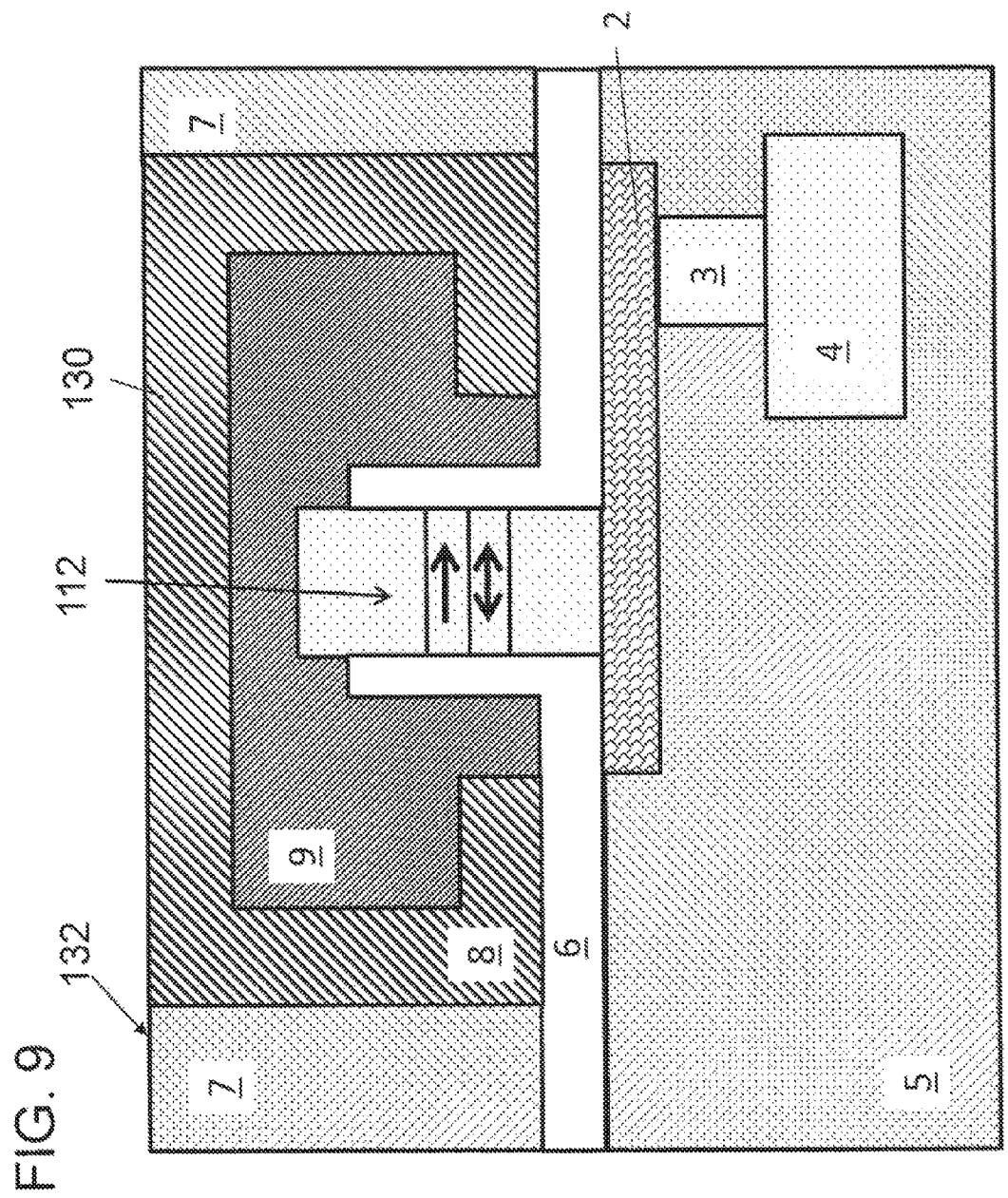
FIG. 9 is a cross-sectional view of the device structure of FIG. 8 after a CMP process to remove the magnetic material outside the trench in accordance with the present principles

Referring to FIG. 9, a CMP process is performed on the top magnetic layer 130 to remove the ferromagnetic material outside the trench to a top surface 132. Note that the liner 8, magnetic layer 130 and plating material 9 may extend into and out of the page and preferably connect with a plurality of MJT stacks 112. During read and write operations, current through the plating material 9, which acts as a bit line provides a higher magnetic field concentration as a result of the armature or yoke formed by the magnetic liner 8 and the magnetic layer 130. This structure concentrates a magnetic field and enables a reduction in power for each cell (and the chip or device as a whole) to achieve read and write operations. The magnetic layer 130 focuses its magnetic field on the gap (122) formed across the structure 112 forming a gapped magnetic core where the gap is filled with material from line 9.

Figure 10:
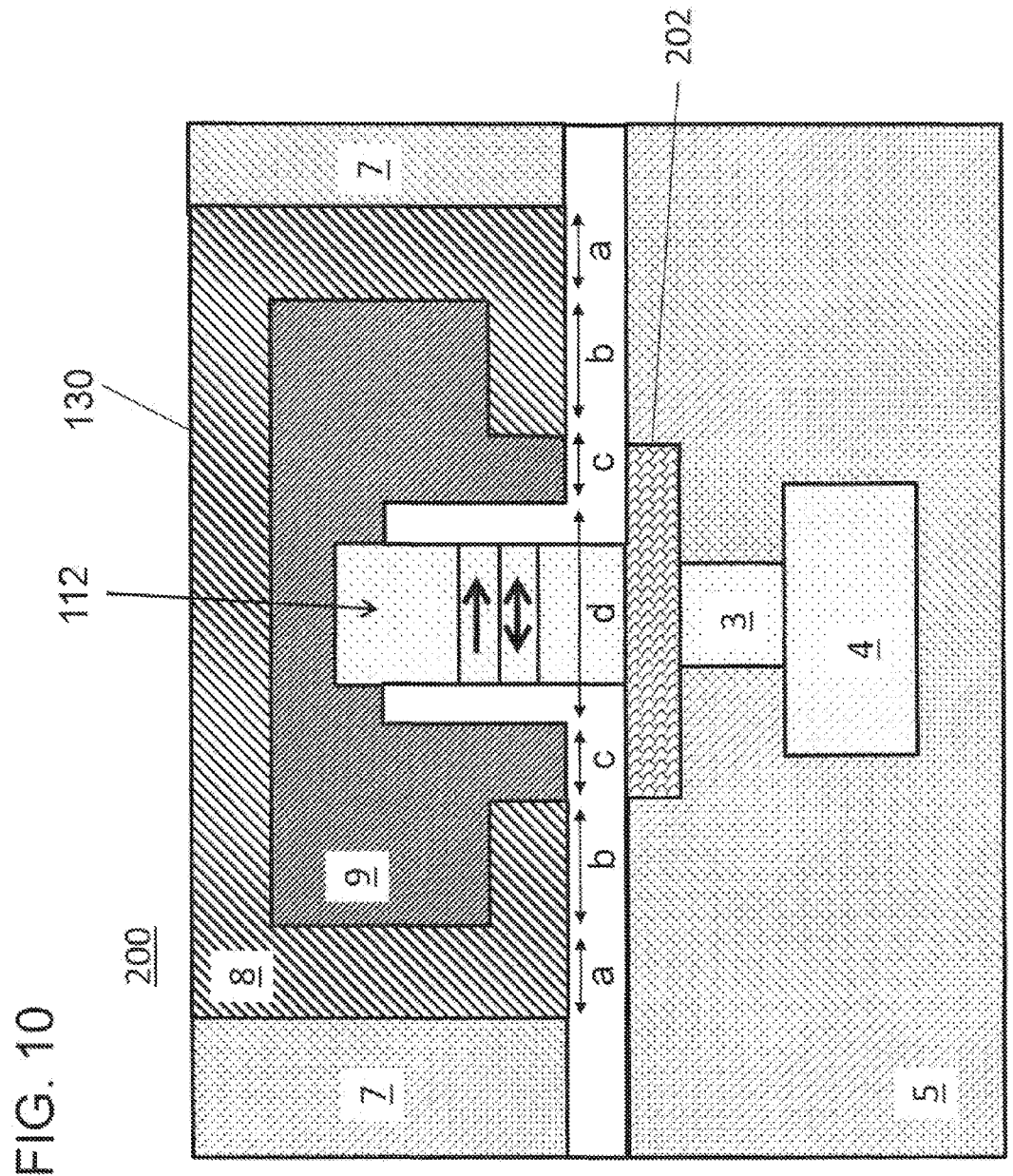
FIG. 10 is a cross-sectional view of a device structure showing the stack and a metal connection and via in vertical alignment in accordance with the present principles.

Referring to FIG. 10, another MRAM device structure 200 includes an aligned strap 202 (instead of an offset strap 2) and metal line 4 and via 3. The device 202 includes a metal wire or line 4. The device 202 includes illustrative dimensions for several features to demonstrate one possible embodiment. Other dimensions and structures may also be employed in accordance with the present principles. In one example, 2a+2b+2c+d may be approximately about 250 nm.

By eliminating the offset strap, device density may be increased. For example, minimum pitch in a large pitch direction may be 250 nm+140 nm (space), and minimum pitch in a small pitch direction may be=280 nm (140 nm line+140 nm space). In one example, a cell size may have an area of 13.5 $F^2$ where F is a minimum feature size achievable with lithography (F may be equal to e.g., 90 nm in one embodiment, although smaller F's are contemplated). In the example, a=25 nm, b=25 nm, c=25 nm, d=100 nm. Other dimensions and proportions are also contemplated. The field concentration may be adjusted based upon gap length of the gapped core, material selection, current flow, etc.

Figure 11:
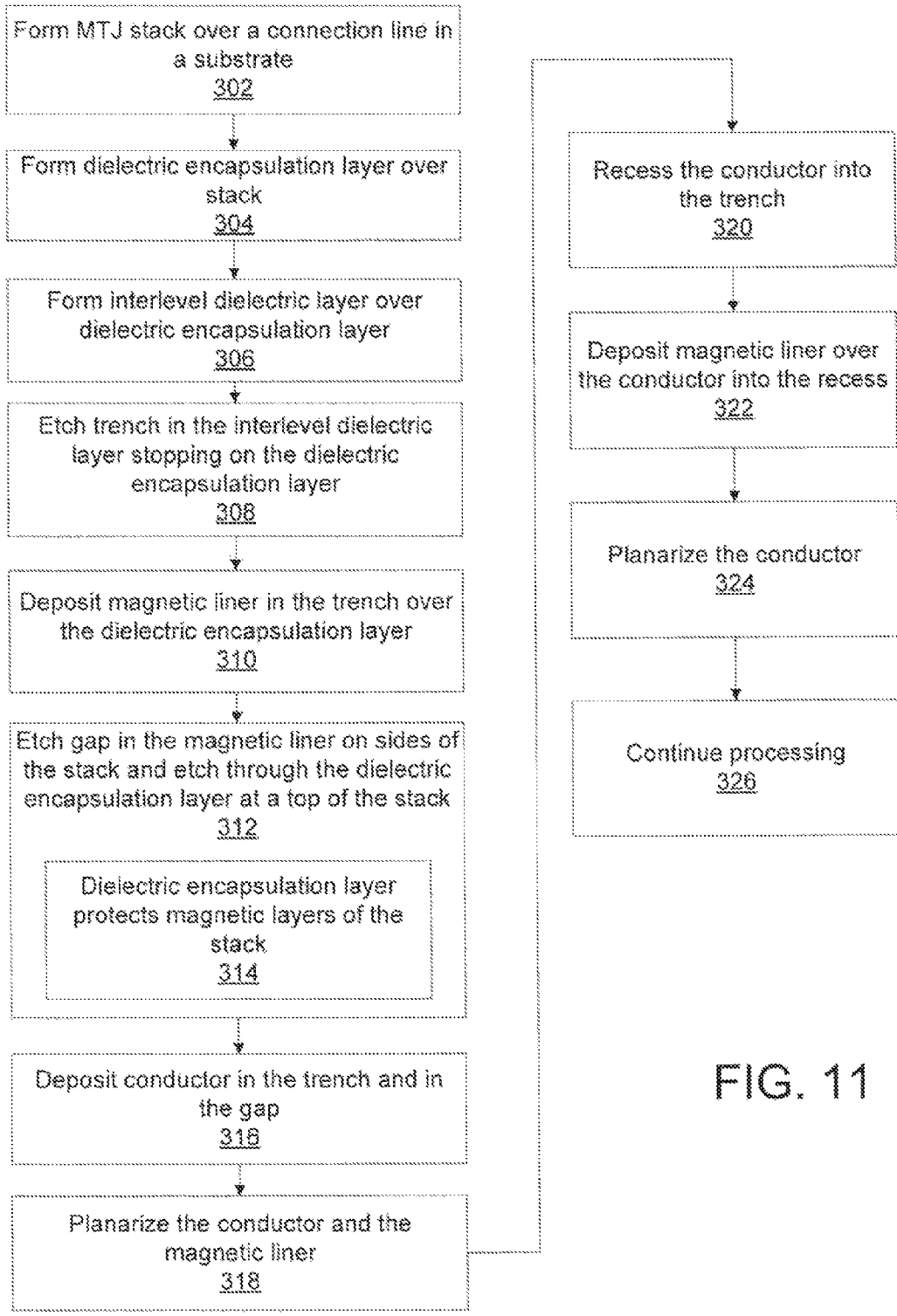
FIG. 11 is a block/flow diagram showing methods for fabrication of a device structure for a magnetoresistive random access memory (MRAM) device in accordance with illustrative embodiments.

Referring to FIG. 11, methods for fabrication a device structure for a magnetoresistive random access memory (MRAM) device are shown in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a magnetoresistive tunnel junction (MTJ) stack is formed over a connection line, which is formed in a dielectric substrate layer. The stack may include conductive barrier layers, which sandwich a storage magnetic layer and a sense magnetic layer, which are in turn separated by a non-magnetic tunnel barrier. The connection line connects to a via and may be offset from a centerline of the stack, or the connection line connects to a via and the connection line and the via are aligned with a centerline of the stack.

In block 304, a dielectric encapsulation layer is conformally deposited over the stack and the dielectric substrate layer. In block 306, an interlevel dielectric layer is formed over the dielectric encapsulation layer. In block 308, a trench is etched in the interlevel dielectric layer stopping on the dielectric encapsulation layer over the stack. In block 310, a magnetic liner is deposited in the trench and on the dielectric encapsulation layer over the stack. In block 312, a gap is etched in the magnetic liner to space the liner from sidewalls of the dielectric encapsulation layer, and the dielectric encapsulation layer is partially removed to expose the stack on a top portion. In block 314, the dielectric encapsulation layer is etched to remain over magnetic layers of the stack so that the magnetic layers of the stack remain protected by the dielectric encapsulation layer.

In block 316, a conductor is deposited in the trench and in the gap. In block 318, the conductor and the magnetic liner are planarized to a top surface of the interlevel dielectric layer to form an armature-clad conductor. In block 320, the conductor is recessed in the trench. In block 322, a magnetic liner material is deposited over the conductor to connect the magnetic liner that lines the sidewalls of the trench. In block 324, the conductor is planarized (e.g., CMP) to a top surface of the interlevel dielectric layer. In block 326, processing is continued as needed to complete the device or chip.

Having described preferred embodiments armature-clad MRAM device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a magnetoresistive memory cell, comprising:
    forming a magnetoresistive memory tunnel junction stack over a connection line formed in a dielectric substrate layer;
    conformally depositing a dielectric encapsulation layer over the stack and the dielectric substrate layer;
    forming an interlevel dielectric layer over the dielectric encapsulation layer;
    etching a trench in the interlevel dielectric layer stopping on the dielectric encapsulation layer over the stack;
    depositing a magnetic liner in the trench and on the dielectric encapsulation layer over the stack;
    etching a gap in the magnetic liner to space the liner from sidewalls of the dielectric encapsulation layer and to remove the dielectric encapsulation layer to expose the stack;
    depositing a conductor in the trench and in the gap; and
    planarizing the conductor and the magnetic liner to a top surface of the interlevel dielectric layer.

2. The method as recited in claim 1, further comprising:
    recessing the conductor in the trench; and
    depositing a magnetic liner material over the conductor to connect the magnetic liner that lines the sidewalls of the trench.

3. The method as recited in claim 1, further comprising:
    forming a recess in the dielectric substrate layer; and
    forming a strap conductor in the recess to connect the connection line to a via.

4. The method according to claim 3, further comprising forming a barrier dielectric layer over the strap conductor and a surface of the dielectric substrate layer.

5. The method as recited in claim 1, wherein the connection line connects to a via and is offset from a centerline of the stack.

6. The method as recited in claim 1, wherein the connection line connects to a via and the connection line and the via are aligned with a centerline of the stack.

7. The method as recited in claim 1, wherein etching a gap in the magnetic liner to space the liner from sidewalls of the dielectric encapsulation layer and to remove the dielectric encapsulation layer to expose the stack includes protecting magnetic layers of the stack with the dielectric encapsulation layer.

8. The method as recited in claim 1, wherein etching a gap in the magnetic liner includes adjusting a gap distance to adjust intensity of the applied magnetic field in operation.

9. The method as recited in claim 1, wherein depositing a magnetic liner includes depositing ferromagnetic materials.

10. The method as recited in claim 1, wherein the dielectric substrate layer is formed on a semiconductor substrate.

11. A method for forming a magnetoresistive memory cell, comprising:
    forming a magnetoresistive memory tunnel junction stack over a connection line formed in a dielectric substrate layer;
    conformally depositing a dielectric encapsulation layer over the stack and the dielectric substrate layer;

forming an interlevel dielectric layer over the dielectric encapsulation layer;
etching a trench in the interlevel dielectric layer stopping on the dielectric encapsulation layer over the stack;
depositing a magnetic liner in the trench and on the dielectric encapsulation layer over the stack;
forming an etch mask over the magnetic liner to expose portions of the magnetic liner over the stack;
etching a gap in the magnetic liner to space the liner from sidewalls of the dielectric encapsulation layer and to remove the dielectric encapsulation layer to expose the stack;
depositing a conductor in the trench and in the gap; and
planarizing the conductor and the magnetic liner to a top surface of the interlevel dielectric layer.

12. The method as recited in claim 11, further comprising:
recessing the conductor in the trench; and
depositing a magnetic liner material over the conductor to connect the magnetic liner that lines the sidewalls of the trench.

13. The method as recited in claim 11, further comprising:
forming a recess in the dielectric substrate layer; and
forming a strap conductor in the recess to connect the connection line to a via.

14. The method according to claim 13, further comprising forming a barrier dielectric layer over the strap conductor and a surface of the dielectric substrate layer.

15. The method as recited in claim 11, wherein the connection line connects to a via and is offset from a centerline of the stack.

16. The method as recited in claim 11, wherein the connection line connects to a via and the connection line and the via are aligned with a centerline of the stack.

17. The method as recited in claim 11, wherein etching a gap in the magnetic liner to space the liner from sidewalls of the dielectric encapsulation layer and to remove the dielectric encapsulation layer to expose the stack includes protecting magnetic layers of the stack with the dielectric encapsulation layer.

18. The method as recited in claim 11, wherein etching a gap in the magnetic liner includes adjusting a gap distance to adjust intensity of the applied magnetic field in operation.

19. The method as recited in claim 11, wherein depositing a magnetic liner includes depositing ferromagnetic materials.

20. The method as recited in claim 11, wherein the dielectric substrate layer is formed on a semiconductor substrate.

* * * * *